(12) United States Patent
Bedell et al.

(10) Patent No.: US 9,941,355 B1
(45) Date of Patent: Apr. 10, 2018

(54) CO-INTEGRATION OF ELASTIC AND PLASTIC RELAXATION ON THE SAME WAFER

(71) Applicant: International Business Machines Corporation, Armonk, NY (US)

(72) Inventors: Stephen W. Bedell, Wappingers Falls, NY (US); Nicolas J. Loubet, Guilderland, NY (US); Devendra K. Sadana, Pleasantville, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/403,696

(22) Filed: Jan. 11, 2017

(51) Int. Cl.
| | |
|---|---|
| *H01L 27/00* | (2006.01) |
| *H01L 29/00* | (2006.01) |
| *H01L 21/00* | (2006.01) |
| *H01L 29/10* | (2006.01) |
| *H01L 29/165* | (2006.01) |
| *H01L 29/78* | (2006.01) |
| *H01L 29/06* | (2006.01) |
| *H01L 27/11* | (2006.01) |
| *H01L 29/66* | (2006.01) |
| *H01L 21/8238* | (2006.01) |
| *H01L 21/02* | (2006.01) |

(52) U.S. Cl.
CPC .... *H01L 29/1054* (2013.01); *H01L 21/02532* (2013.01); *H01L 21/823807* (2013.01); *H01L 21/823821* (2013.01); *H01L 21/823878* (2013.01); *H01L 27/1104* (2013.01); *H01L 29/0649* (2013.01); *H01L 29/165* (2013.01); *H01L 29/66795* (2013.01); *H01L 29/785* (2013.01)

(58) Field of Classification Search
CPC ..... H01L 21/823807; H01L 21/823821; H01L 21/823878; H01L 27/1104; H01L 27/1211; H01L 27/0886; H01L 29/1054; H01L 29/0649; H01L 29/165; H01L 29/66795; H01L 29/785; H01L 21/02532
See application file for complete search history.

(56) References Cited

U.S. PATENT DOCUMENTS

| | | |
|---|---|---|
| 9,171,904 B2 | 10/2015 | Eneman et al. |
| 9,276,117 B1 | 3/2016 | Lee et al. |
| 9,368,498 B2 | 6/2016 | Eneman et al. |
| 9,368,578 B2 | 6/2016 | Pawlak et al. |
| 9,368,604 B1 | 6/2016 | Dal et al. |
| 2015/0050753 A1 | 2/2015 | Srinivasan et al. |
| 2016/0104799 A1 | 4/2016 | Qi et al. |
| 2016/0126109 A1 | 5/2016 | Sun et al. |
| 2016/0133746 A1 | 5/2016 | Su et al. |
| 2016/0190304 A1 | 6/2016 | Morin et al. |

*Primary Examiner* — Nikolay Yushin
(74) *Attorney, Agent, or Firm* — Cantor Colburn LLP; Vazken Alexanian

(57) ABSTRACT

An n-doped field effect transistor (nFET) section of an integrated device logic region is provided. The nFET section includes a semiconductor substrate, a layer at least partially formed of silicon germanium (SiGe) disposed on the semiconductor substrate and fin formations. The fin formations are formed on the layer. Each fin formation includes a first fin portion that is at least partially formed of silicon (Si) and a second fin portion that is at least partially formed of hard mask material. The layer is etched to include free surfaces that facilitate elastic relaxation of SiGe therein and a corresponding application of tension in Si of the first fin portion of each of the fin formations.

20 Claims, 15 Drawing Sheets

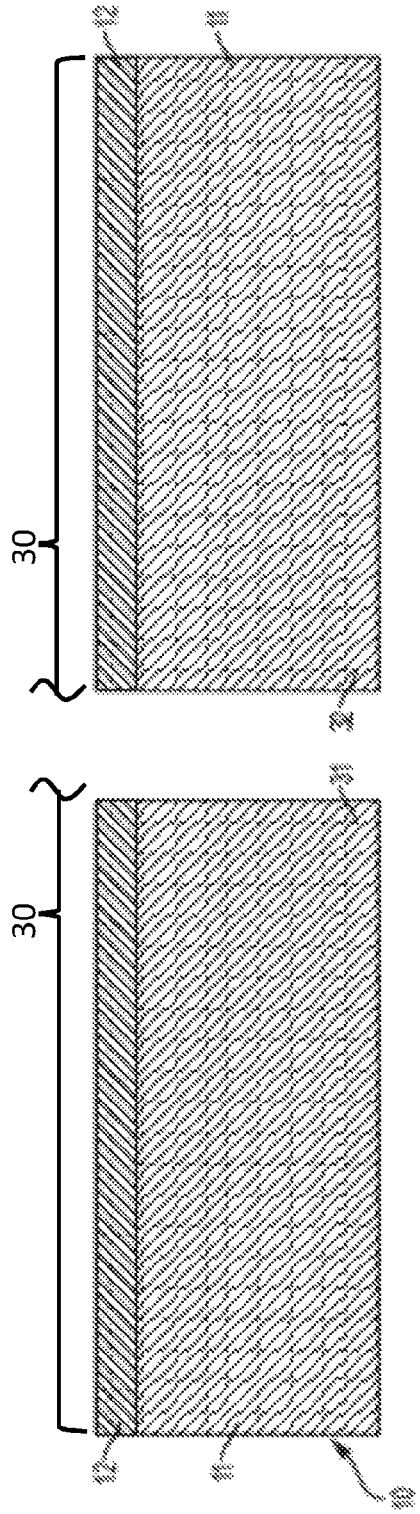
FIG. 1B
FIG. 1A
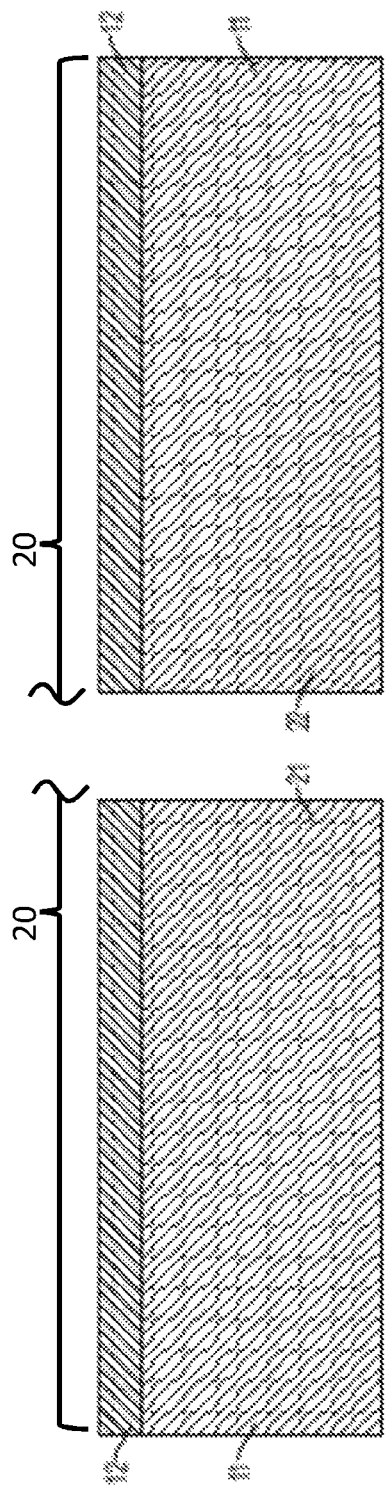
FIG. 1D
FIG. 1C

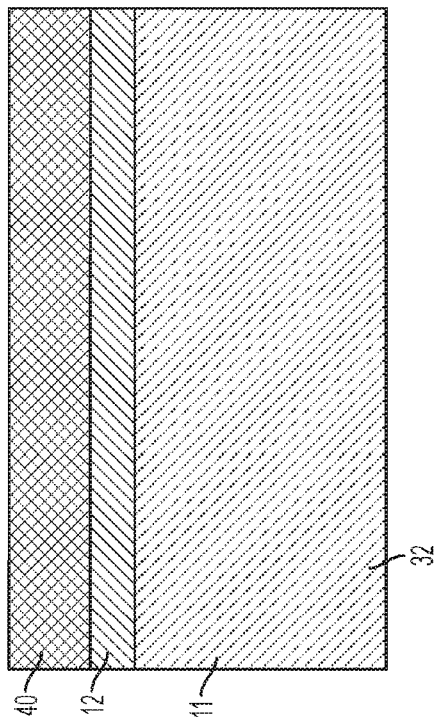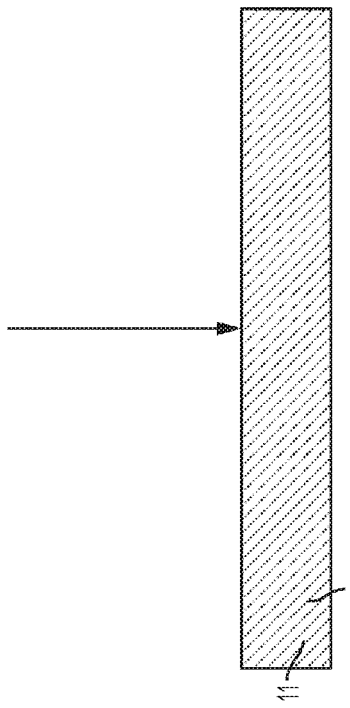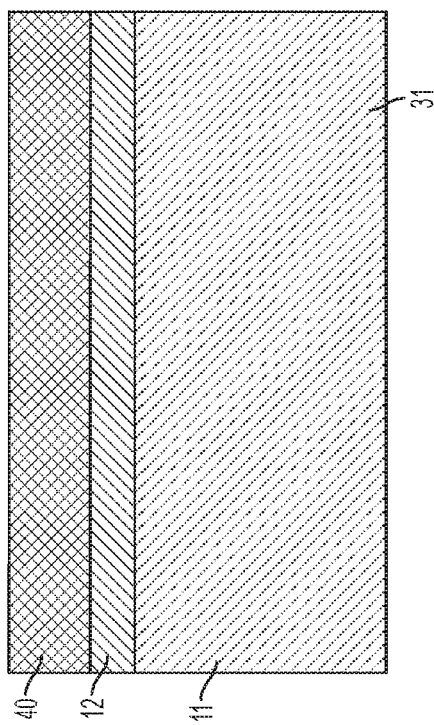
FIG. 2B  FIG. 2A
FIG. 2D  FIG. 2C
DEEP RECESS >2μM

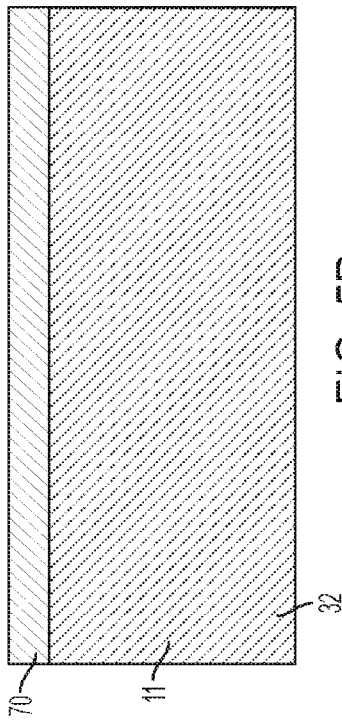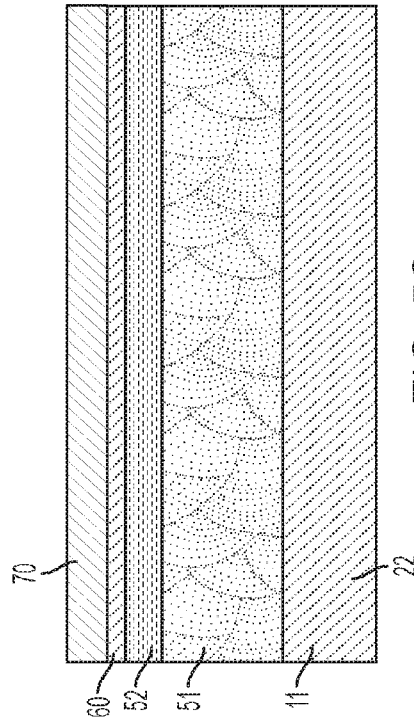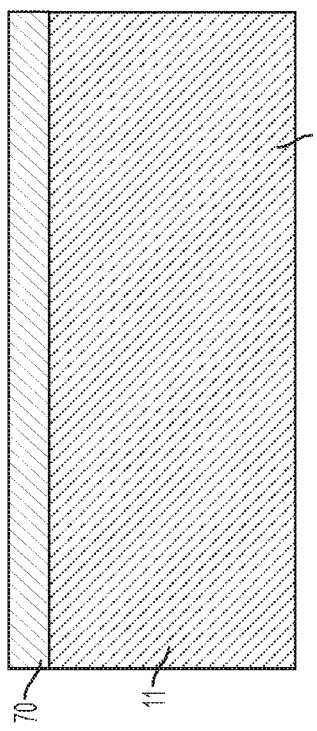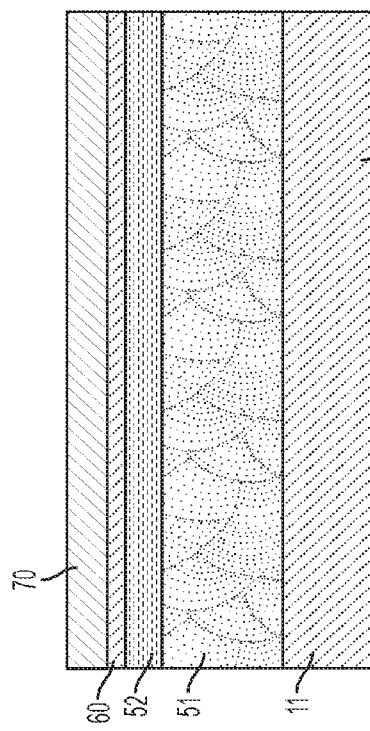

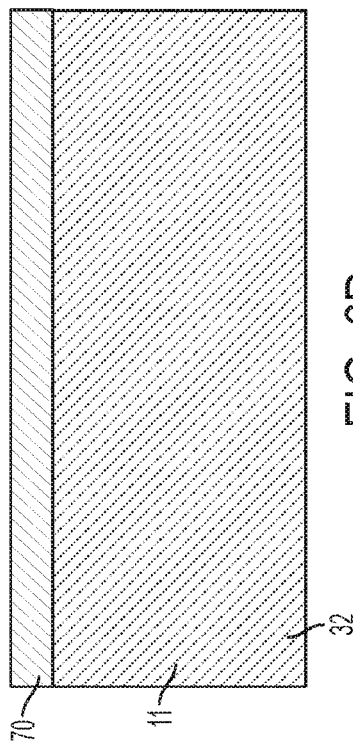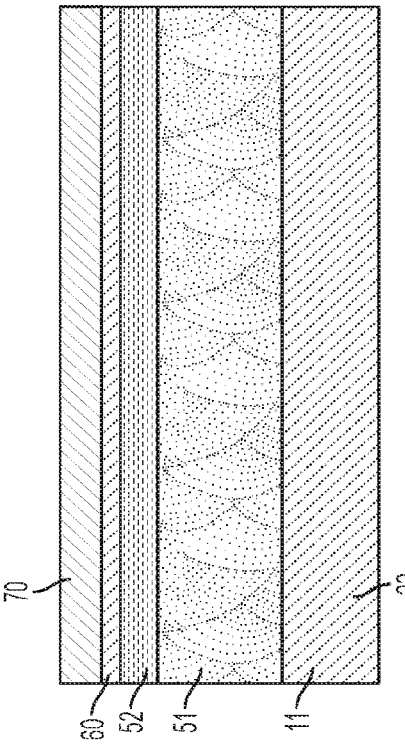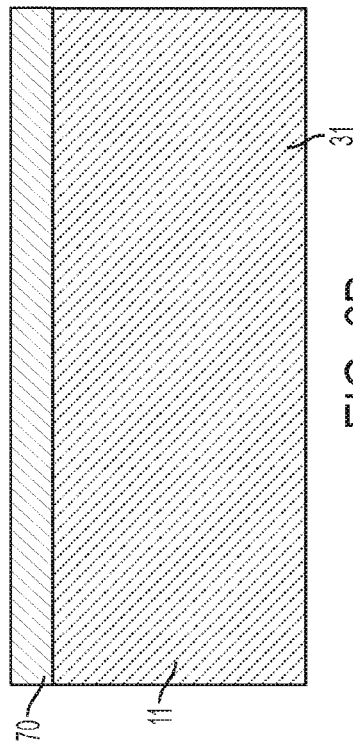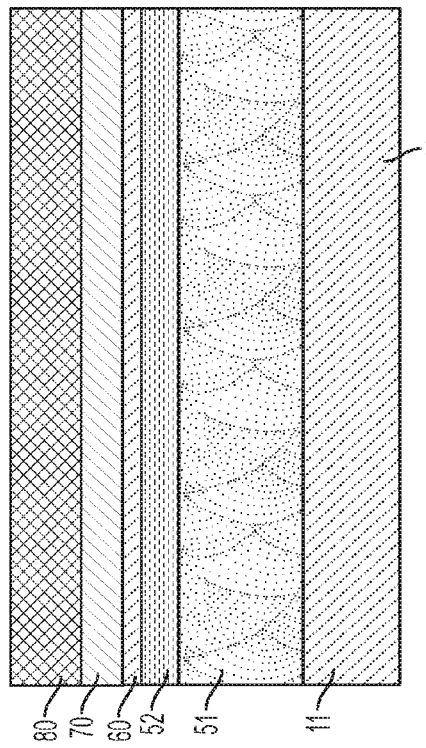

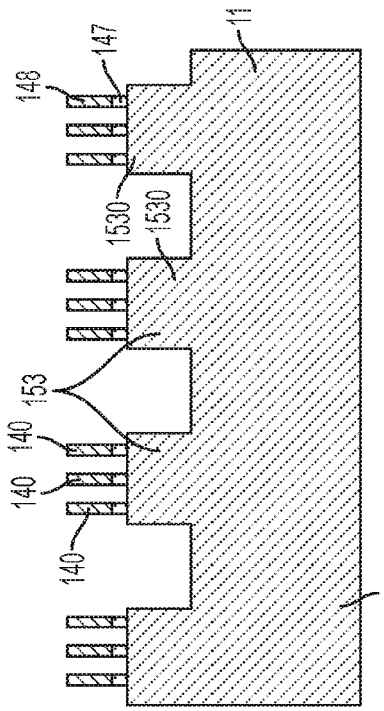
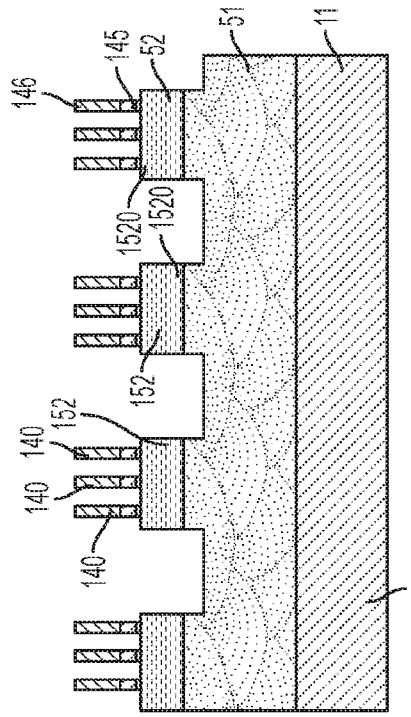
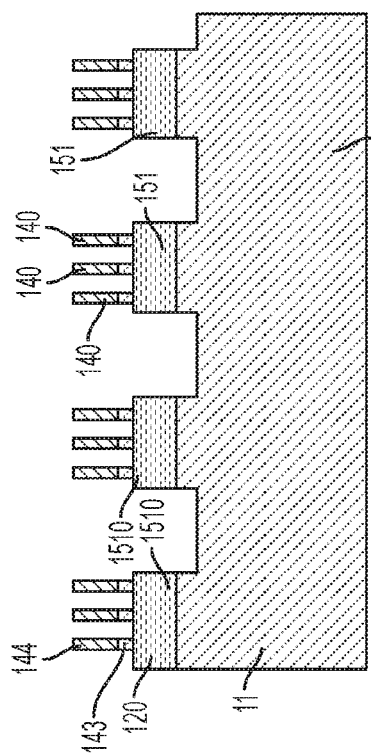
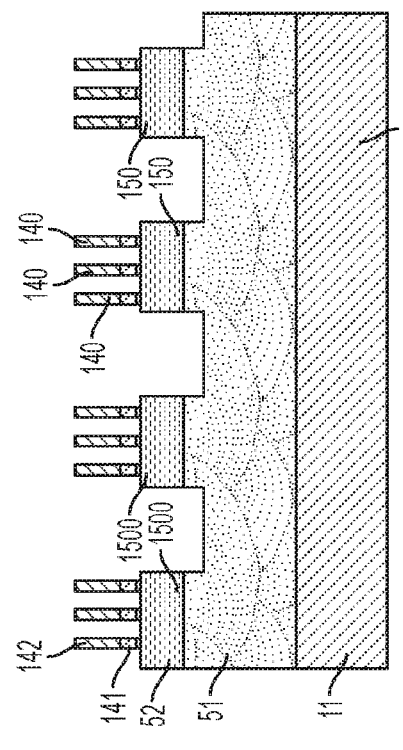
FIG. 14B
FIG. 14D
FIG. 14A
FIG. 14C

CO-INTEGRATION OF ELASTIC AND PLASTIC RELAXATION ON THE SAME WAFER

BACKGROUND

The present invention relates to semiconductor devices and, more specifically, to co-integration of elastic and plastic relaxation on the same wafer.

In current or conventional semiconductor device manufacturing, some semiconductor devices are characterized in that they are manufactured to include a blanket silicon germanium (SiGe) layer that is grown everywhere on a wafer. This can occur even if that wafer includes n-doped field effect transistor (nFET) sections, in which tensile silicon (Si) is used, and p-doped field effect transistor (pFET) sections, in which compressive SiGe is used.

This situation leads to a requirement that a very high percentage or concentration of germanium (Ge) in layers of the pFET sections be grown over relaxed SiGe layers in order to generate sufficient compressive stress in the channel material. Defect formation can be an issue during the plastic relaxation of SiGe, especially if the thickness or Ge concentration is too important. In order to avoid degraded device performance and defect formation in FinFET technologies, it is possible to use the elastic relaxation of SiGe, but such elastic relaxation is not normally applicable to static random access memory (SRAM) regions where fins are typically never cut.

SUMMARY

According to a non-limiting embodiment of the present invention, an n-doped field effect transistor (nFET) section of an integrated device logic region is provided. The nFET section includes a semiconductor substrate, a layer at least partially formed of silicon germanium (SiGe) disposed on the semiconductor substrate and fin formations. The fin formations are formed on the layer. Each fin formation includes a first fin portion that is at least partially formed of silicon (Si) and a second fin portion that is at least partially formed of hard mask material. The layer is etched to include free surfaces that facilitate elastic relaxation of SiGe therein and a corresponding application of tension in Si of the first fin portion of each of the fin formations.

According to another non-limiting embodiment, an integrated device is provided and includes a static random access memory (SRAM) region and a logic region. The SRAM region includes an n-doped field effect transistor (nFET) section in which tensile silicon (Si) fins are formed on a plastically relaxed silicon germanium (SiGe) substrate. The logic region includes an nFET section in which tensile silicon fins are formed on an elastically relaxed SiGe substrate.

According to yet another non-limiting embodiment, a method of processing a wafer is provided. The wafer includes first and second sections of memory and logic regions. The method includes forming fins on a relaxed buffer layer in the first section of the memory region and forming fins on a substrate layer in the first section of the logic region. The method further includes etching the relaxed buffer layer to encourage plastic relaxation of the relaxed buffer layer and a corresponding application of tension to the fins in the first section of the memory region. In addition, the method also includes etching the substrate layer to encourage elastic relaxation of the substrate layer and a corresponding application of tension to the fins in the first section of the logic region.

Additional features are realized through the techniques of the present invention. Other embodiments are described in detail herein and are considered a part of the claimed invention. For a better understanding of the invention with the features, refer to the description and to the drawings.

BRIEF DESCRIPTION OF THE DRAWINGS

The subject matter which is regarded as the invention is particularly pointed out and distinctly claimed in the claims at the conclusion of the specification. The foregoing and other features of the invention are apparent from the following detailed description taken in conjunction with non-limiting embodiments illustrated in the accompanying drawings. In particular, FIGS. 1A-1D through 15A-15D are provided to illustrate a method of processing a wafer according to exemplary embodiments of the present teachings, in which:

FIG. 1A is a side view of a substrate and a hard mask of an n-doped field effect transistor (nFET) section of a static random access memory (SRAM) region of a wafer to be formed into an integrated device in accordance with one or more embodiments;

FIG. 1B is a side view of a substrate and a hard mask of an nFET section of a logic region of a wafer to be formed into an integrated device in accordance with one or more embodiments;

FIG. 1C is a side view of a substrate and a hard mask of a p-doped field effect transistor (pFET) section of an SRAM region of a wafer to be formed into an integrated device in accordance with one or more embodiments;

FIG. 1D is a side view of a substrate and a hard mask of a pFET section of a logic region of a wafer to be formed into an integrated device in accordance with one or more embodiments;

FIG. 2A is a side view of a recessed substrate of the nFET section of the SRAM region in accordance with one or more embodiments;

FIG. 2B is a side view of a photoresist block disposed over the hard mask of the nFET section of the logic region in accordance with one or more embodiments;

FIG. 2C is a side view of a recessed substrate of the pFET section of the SRAM region in accordance with one or more embodiments;

FIG. 2D is a side view of a photoresist block disposed over the hard mask of the pFET section of the logic region in accordance with one or more embodiments;

FIG. 5A is a side view of a hard mask deposited on the tensile silicon layer of the nFET section of the SRAM region in accordance with one or more embodiments;

FIG. 5B is a side view of the substrate and a new hard mask of the nFET section of the logic region in accordance with one or more embodiments;

FIG. 5C is a side view of a hard mask deposited on the tensile silicon layer of the pFET section of the SRAM region in accordance with one or more embodiments;

FIG. 5D is a side view of the substrate and a new hard mask of the pFET section of the logic region in accordance with one or more embodiments;

FIG. 6A is a side view of a photoresist block deposited on the hard mask of the nFET section of the SRAM region in accordance with one or more embodiments;

FIG. 6B is a side view of the substrate and the new hard mask of the nFET section of the logic region in accordance with one or more embodiments;

FIG. 6C is a side view of the hard mask deposited on the tensile silicon layer of the pFET section of the SRAM region in accordance with one or more embodiments;

FIG. 6D is a side view of the substrate and the new hard mask of the pFET section of the logic region in accordance with one or more embodiments;

FIG. 14A is a side view of pillars formed from etching processes in the nFET section of the SRAM region in accordance with one or more embodiments;

FIG. 14B is a side view of pillars formed from etching processes in the nFET section of the logic region in accordance with one or more embodiments;

FIG. 14C is a side view of pillars formed from etching processes in the pFET section of the SRAM region in accordance with one or more embodiments;

FIG. 14D is a side view of pillars formed from etching processes in the pFET section of the logic region in accordance with one or more embodiments;

FIG. 15A is a side view of shallow trench isolation (STI) elements deposited between pillars in the nFET section of the SRAM region in accordance with one or more embodiments;

FIG. 15B is a side view of STI elements deposited between pillars in the nFET section of the logic region in accordance with one or more embodiments;

FIG. 15C is a side view of STI elements deposited between pillars in the pFET section of the SRAM region in accordance with one or more embodiments; and FIG. 15D is a side view of STI elements deposited between pillars in the pFET section of the logic region in accordance with one or more embodiments.

DETAILED DESCRIPTION

Figure 3B:
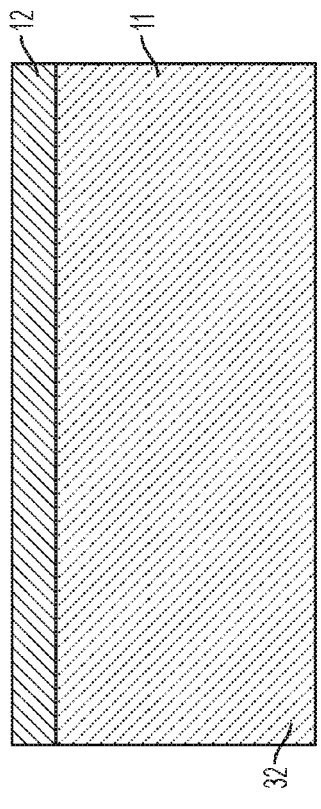
FIG. 3B is a side view of the substrate and the hard mask of the nFET section of the logic region in accordance with one or more embodiments.
Figure 3D:
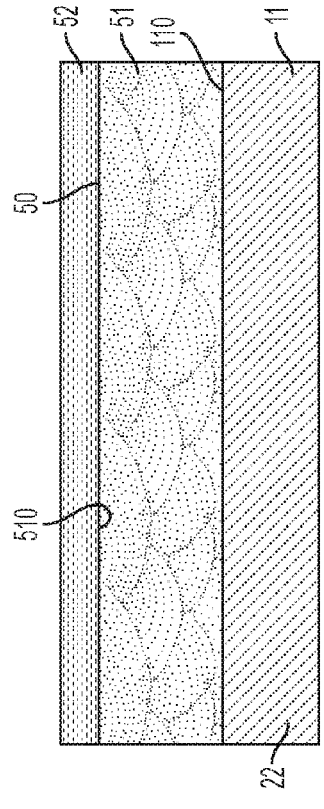
FIG. 3D is a side view of the substrate and the hard mask of the pFET section of the logic region in accordance with one or more embodiments.
Figure 3A:
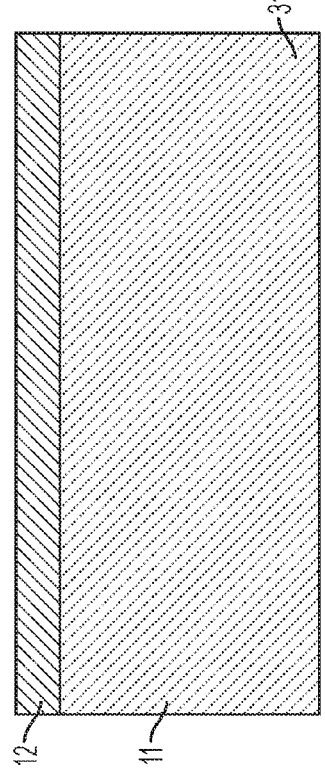
FIG. 3A is a side view of a relaxed substrate of the nFET section of the SRAM region in accordance with one or more embodiments.
Figure 3C:
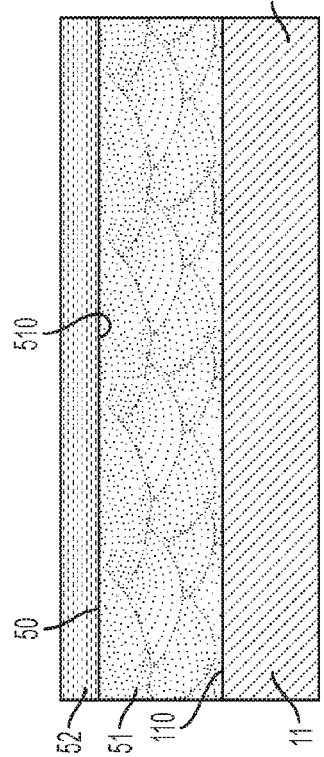
FIG. 3C is a side view of a relaxed substrate of the pFET section of the SRAM region in accordance with one or more embodiments.
Figure 4B:
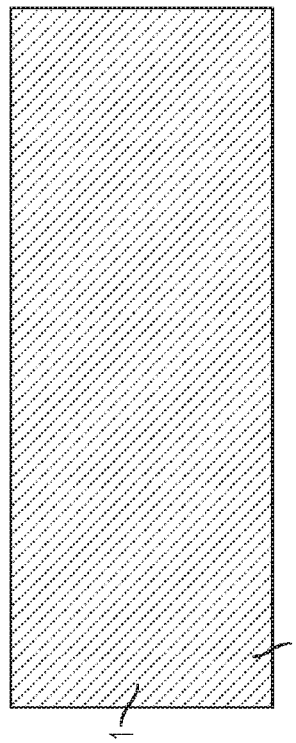
FIG. 4B is a side view of the substrate with the hard mask removed of the nFET section of the logic region in accordance with one or more embodiments.
Figure 4A:
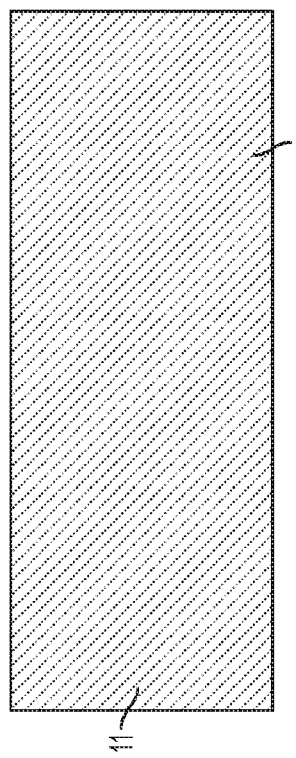
FIG. 4A is a side view of a tensile silicon layer on the relaxed substrate of the nFET section of the SRAM region in accordance with one or more embodiments.
Figure 4D:
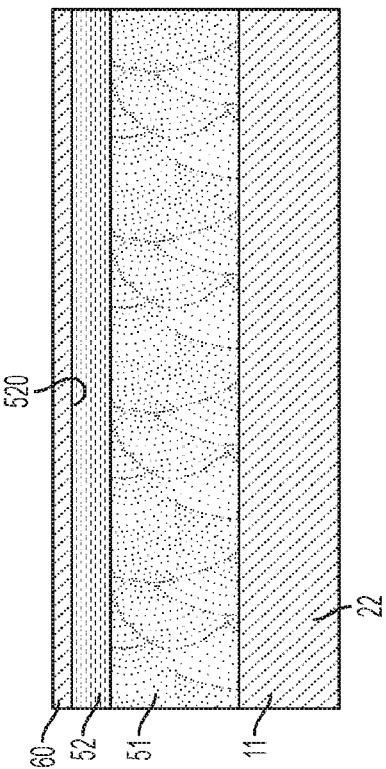
FIG. 4D is a side view of the substrate with the hard mask removed of the pFET section of the logic region in accordance with one or more embodiments.
Figure 4C:
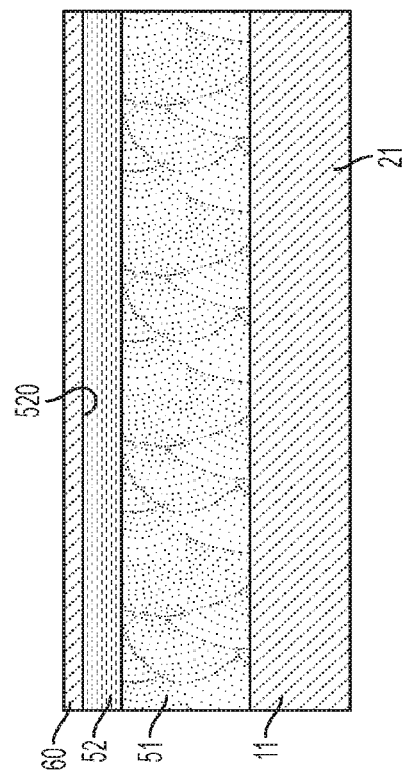
FIG. 4C is a side view of a tensile silicon layer on the relaxed substrate of the pFET section of the SRAM region in accordance with one or more embodiments.
Figure 7D:
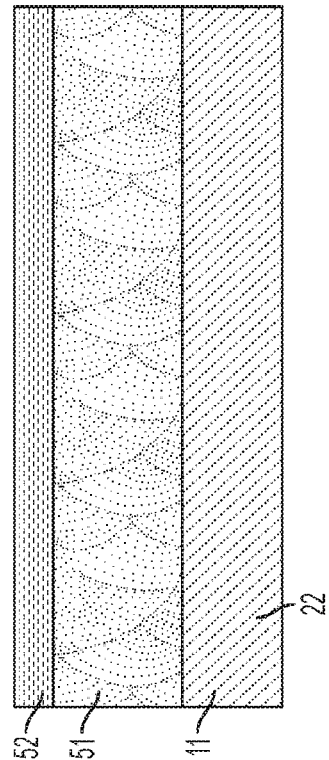
FIG. 7D is a side view of the substrate having been recessed in the pFET section of the logic region in accordance with one or more embodiments.
Figure 7B:
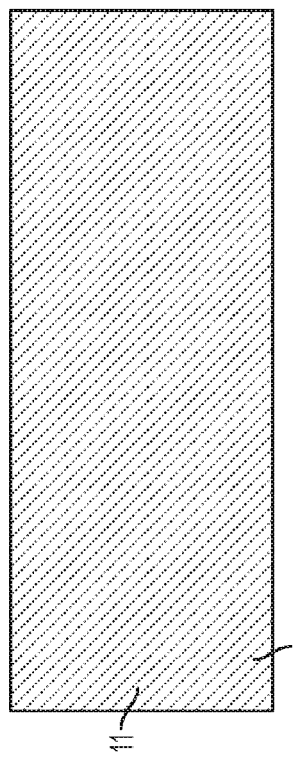
FIG. 7B is a side view of the substrate having been recessed in the nFET section of the logic region in accordance with one or more embodiments.
Figure 7C:
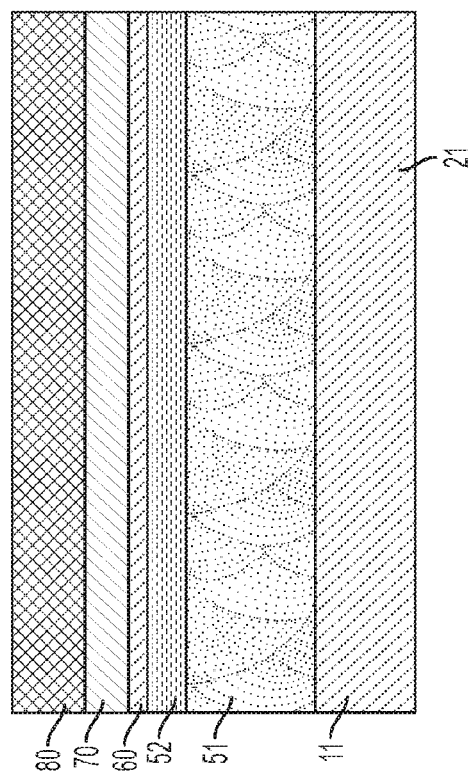
FIG. 7C is a side view of the hard mask and the tensile silicon layer having been removed from the pFET section of the SRAM region in accordance with one or more embodiments.
Figure 7A:
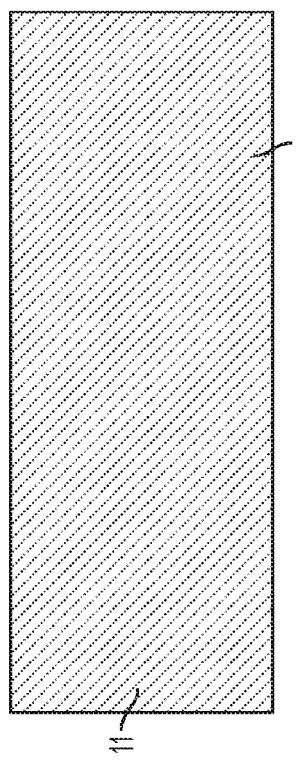
FIG. 7A is a side view of a photoresist block deposited on the hard mask of the nFET section of the SRAM region in accordance with one or more embodiments.
Figure 8D:
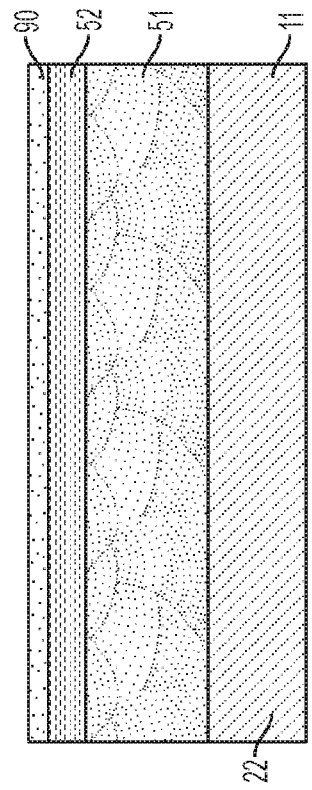
FIG. 8D is a side view of a selective SiGe layer disposed on the recessed substrate in the pFET section of the logic region in accordance with one or more embodiments.
Figure 8C:
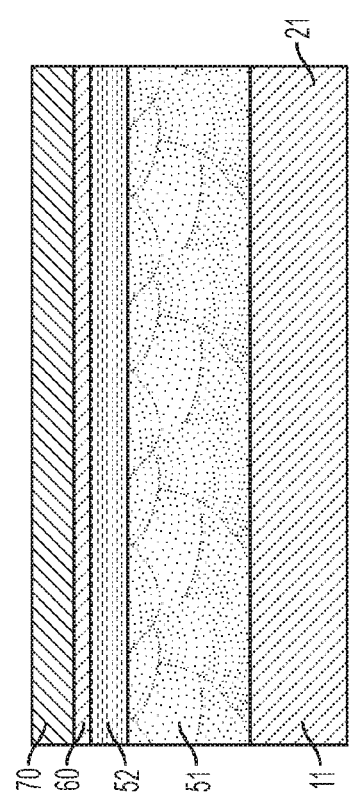
FIG. 8C is a side view of a selective SiGe layer disposed on the SRB layer of the pFET section of the SRAM region in accordance with one or more embodiments.
Figure 8B:
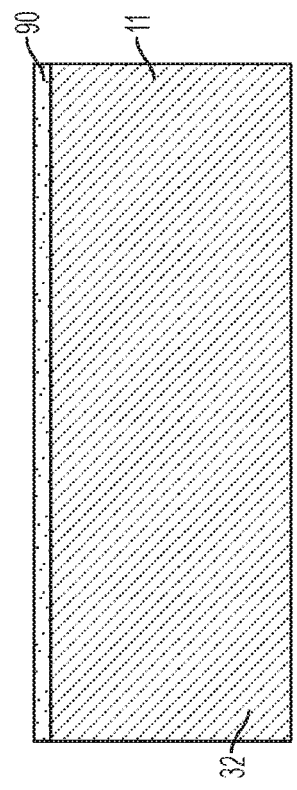
FIG. 8B is a side view of a selective silicon germanium (SiGe) layer disposed on the recessed substrate in the nFET section of the logic region in accordance with one or more embodiments.
Figure 8A:
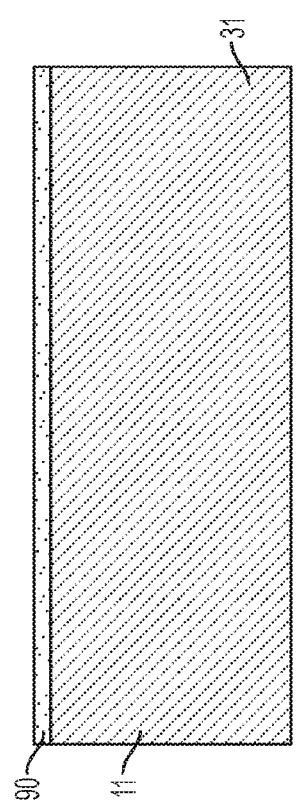
FIG. 8A is a side view of the photoresist block deposited on the hard mask having been removed from the nFET section of the SRAM region in accordance with one or more embodiments.
Figure 9B:
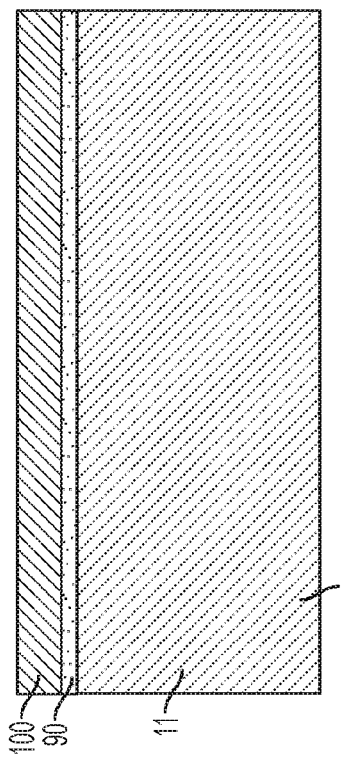
FIG. 9B is a side view of a second new hard mask deposited on the selective SiGe layer of the nFET section of the logic region in accordance with one or more embodiments.
Figure 9D:
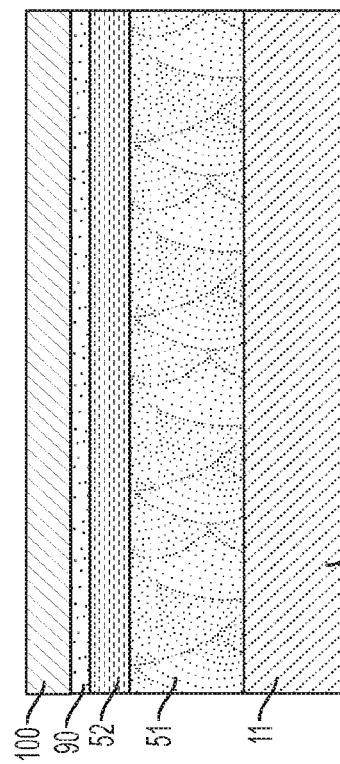
FIG. 9D is a side view of a second new hard mask deposited on the selective SiGe layer of the pFET section of the logic region in accordance with one or more embodiments.
Figure 9A:
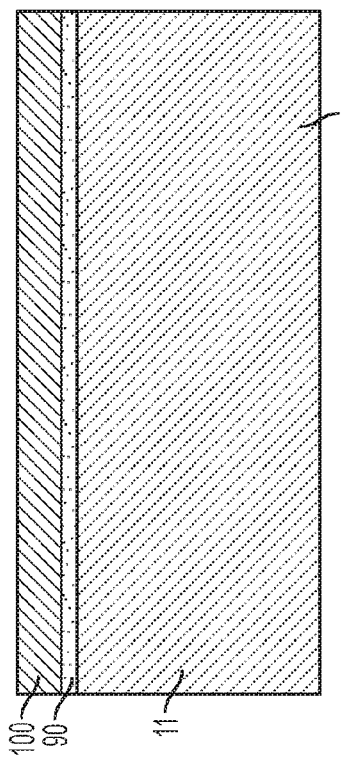
FIG. 9A is a side view of the photoresist block deposited on the hard mask having been removed from the nFET section of the SRAM region in accordance with one or more embodiments.
Figure 9C:
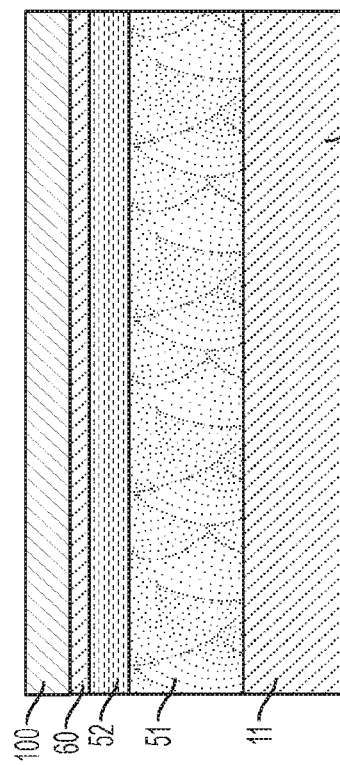
FIG. 9C is a side view of a second new hard mask deposited on the selective SiGe layer of the pFET section of the SRAM region in accordance with one or more embodiments.
Figure 10B:
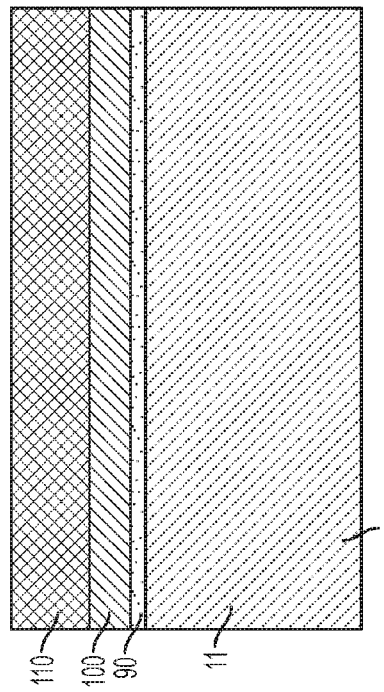
FIG. 10B is a side view of the second new hard mask deposited on the selective SiGe layer of the nFET section of the logic region in accordance with one or more embodiments.
Figure 10D:
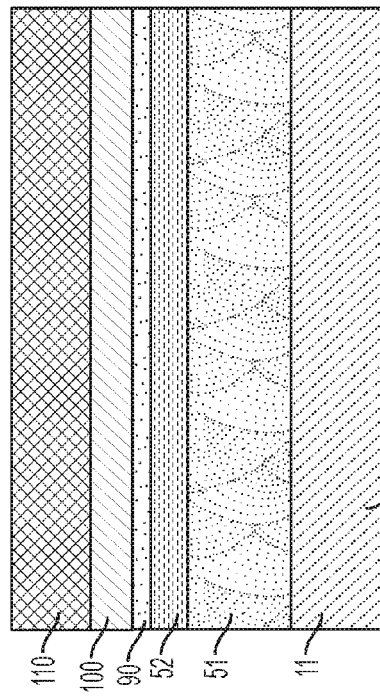
FIG. 10D is a side view of a photoresist block deposited on the second new hard mask of the pFET section of the logic region in accordance with one or more embodiments.
Figure 10A:
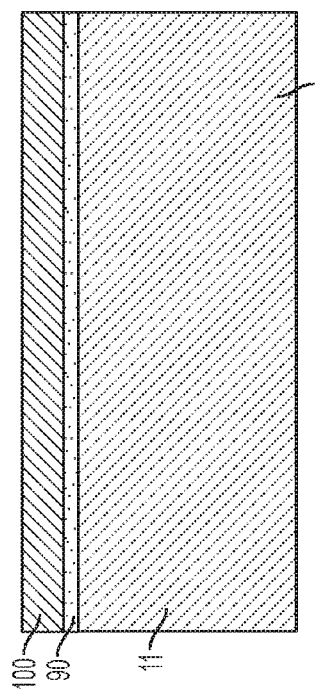
FIG. 10A is a side view of a photoresist block deposited on the hard mask of the nFET section of the SRAM region in accordance with one or more embodiments.
Figure 10C:
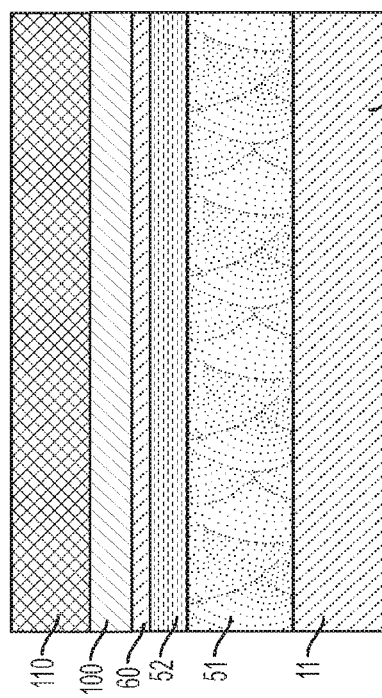
FIG. 10C is a side view of a photoresist block deposited on the second new hard mask of the pFET section of the SRAM region in accordance with one or more embodiments.
Figure 11D:
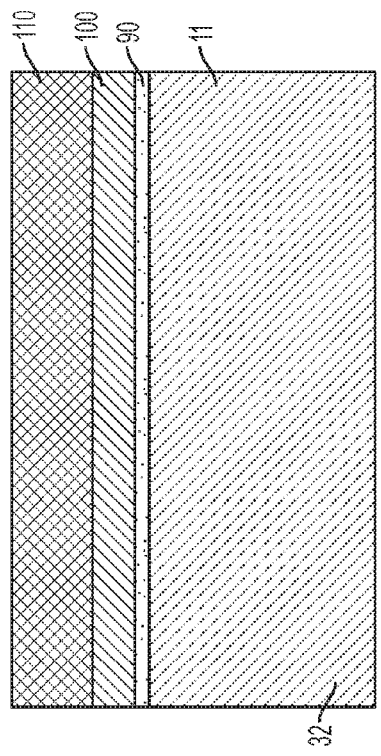
FIG. 11D is a side view of the photoresist block deposited on the second new hard mask of the pFET section of the logic region in accordance with one or more embodiments.
Figure 11C:
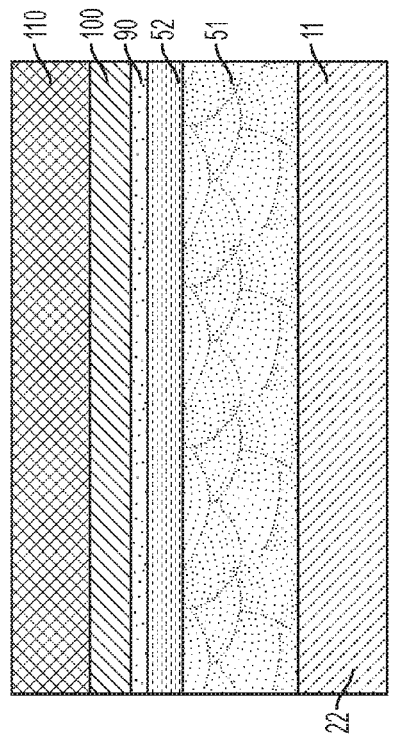
FIG. 11C is a side view of the photoresist block deposited on the second new hard mask of the pFET section of the SRAM region in accordance with one or more embodiments.
Figure 11B:
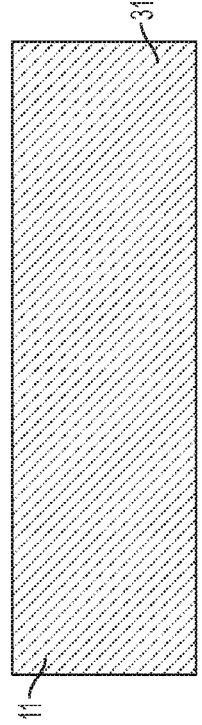
FIG. 11B is a side view of a recessed substrate of the nFET section of the logic region in accordance with one or more embodiments.
Figure 11A:
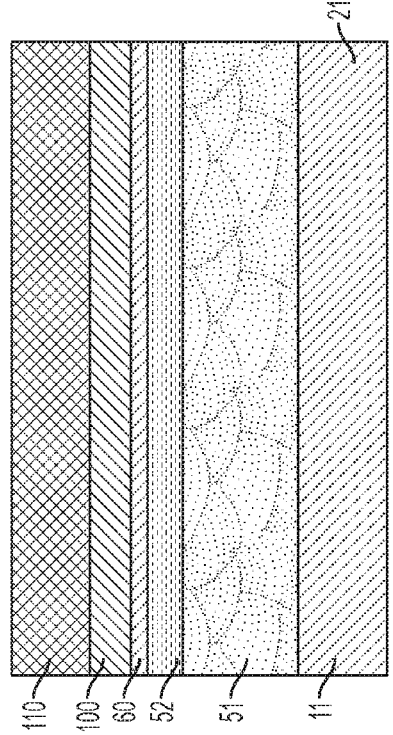
FIG. 11A is a side view of the photoresist block deposited on the hard mask of the nFET section of the SRAM region in accordance with one or more embodiments.
Figure 12B:
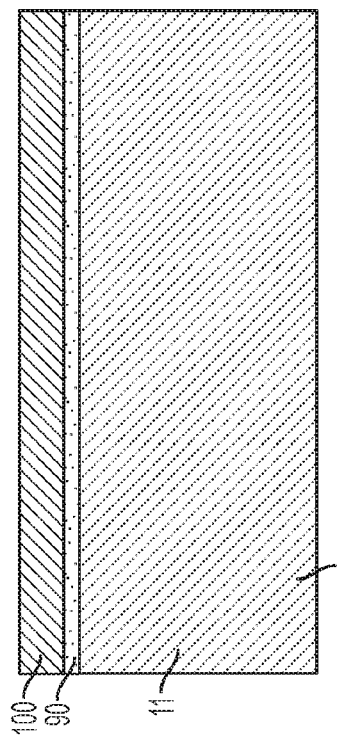
FIG. 12B is a side view of SiGe/Si layers disposed on the recessed substrate of the nFET section of the logic region in accordance with one or more embodiments.
Figure 12D:
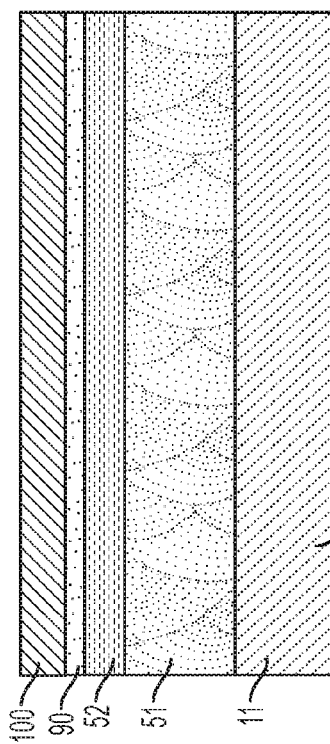
FIG. 12D is a side view of the photoresist block removed from the pFET section of the logic region in accordance with one or more embodiments.
Figure 12A:
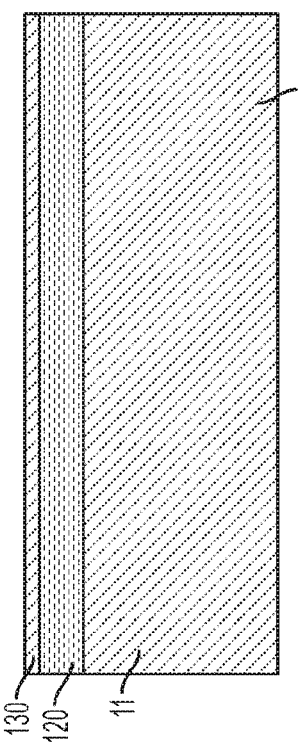
FIG. 12A is a side view of the photoresist block removed from the nFET section of the SRAM region in accordance with one or more embodiments.
Figure 12C:
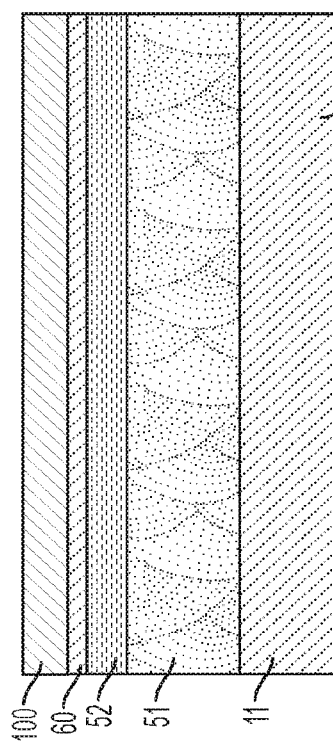
FIG. 12C is a side view of the photoresist block removed from the pFET section of the SRAM region in accordance with one or more embodiments.

Various embodiments of the present invention are described herein with reference to the related drawings. Alternative embodiments can be devised without departing from the scope of this invention. It is noted that various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present invention to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The term "exemplary" is used herein to mean "serving as an example, instance, or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include both an indirect "connection" and a direct "connection."

For the sake of brevity, conventional techniques related to semiconductor device and IC fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the present description utilizes a variety of individually known physical and chemical processes performed on a semiconductor (e.g., silicon) substrate. In general, the various processes used to form a micro-chip that will be packaged into an IC fall into three categories, namely, film deposition, patterning, etching and semiconductor doping. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

Fundamental to all of the above-described fabrication processes is semiconductor lithography, i.e., the formation of three-dimensional relief images or patterns on the semiconductor substrate for subsequent transfer of the pattern to the substrate. In semiconductor lithography, the patterns are a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to an overview of aspects of the present invention, one or more embodiments relate to co-integration of elastic and plastic relaxation of a silicon germanium (SiGe) relaxed buffer layer (SRB) on a same wafer. One or more embodiments also relate to usage of elastic relaxation of SiGe layers to generate tensile strain in silicon to mitigate the generation of defects in logic regions while SRAM processing is completed in potentially conventional manners on thick plastically relaxed SRB.

With reference to FIGS. 1A-1D, a wafer 10 is provided with a first region 20 and a second region 30. The first region 20 includes a first section 21 and a second section 22 and the second region 30 includes a first section 31 and a second section 32. As used herein, the first region 20 can be designated or defined as a static random access memory (SRAM) region 20 and the second region 30 can be designated or defined as a logic region 30. In addition, the first section 21 of the SRAM region 20 can be designated or defined as an SRAM n-doped field effect transistor (nFET) section 21, the second section 22 of the SRAM region 20 can be designated or defined as an SRAM pFET section 22, the first section 31 of the logic region 30 can be designated or defined as a logic n-doped field effect transistor (nFET) section 31 and the second section 32 of the logic region 30 can be designated or defined as a logic pFET section 32.

In any case, as shown in FIGS. 1A-1D, the wafer 10 includes a semiconductor substrate 11 and a deposited hard mask 12 that is formed over an uppermost surface of the semiconductor substrate 11 in each of the SRAM nFET section 21, the SRAM pFET section 22, the logic nFET section 31 and the logic pFET section 32. The semiconductor substrate 11 can be formed as a bulk substrate and can include semiconductor material such as, but not limited to, silicon (Si), silicon germanium (SiGe), strain-relaxed buffer (SRB) SiGe, silicon carbide (SiC), silicon-germanium-carbon (SiGeC) or other like semiconductor material. Although silicon is the predominantly used semiconductor material in wafer fabrication, alternative semiconductor materials can be employed. These alternative semiconductor materials can include, but are not limited to, germanium (Ge), gallium arsenide (GaAs), gallium nitride (GaN), cadmium telluride (CdTe) and zinc selenide (ZnSe). In addition, multiple layers of semiconductor materials can be used as the semiconductor material of the semiconductor substrate 11. The hard mask 12 can be formed of any dielectric material such as, but not limited to silicon dioxide ($SiO_2$) or silicon nitride (SiN).

With reference to FIGS. 2A-2D, a photoresist block 40 is deposited over the hard mask 12 in the logic nFET section 31 and the logic pFET section 32. Once the photoresist block 40 is formed, a deep recession of the SRAM nFET section 21 and the SRAM pFET section 22 is conducted. The recess is executed by deep trench reactive ion etching (RIE) and is conducted to a depth of at least 2 microns. This depth can be measured from an uppermost surface of the hard mask 12 or from the uppermost surface of the semiconductor substrate 11 once the hard mask 12 is removed.

With reference to FIGS. 3A-3D, once the SRAM nFET section 21 and the SRAM pFET section 22 are recessed, the photoresist block 40 is removed from the logic nFET section 31 and the logic pFET section 32 (e.g., by chemical mechanical polishing or CMP) to reveal the hard mask 12. At this point, a SiGe relaxed buffer (SRB) layer 50 is grown or epitaxially grown in the SRAM nFET section 21 and the SRAM pFET section 22. Such epitaxial growth is conducted such that the SRB layer 50 includes a SiGe gradient layer 51 and a constant Ge layer 52 in both the SRAM nFET section 21 and the SRAM pFET section 22. The SiGe gradient layer 51 is formed initially over the uppermost surface 110 of the recessed semiconductor substrate 11 and the constant Ge layer 52 is formed over the uppermost surface 510 of the SiGe layer 51. The SiGe layer 51 has a Ge concentration that increases with increasing vertical distance from the uppermost surface 110 from about 5% to about 20% or more at the uppermost surface 510. The SiGe layer with constant Ge 52 has a constant or uniform concentration of Ge that can be in a range of 20% Ge to as high as 100% Ge (i.e., pure Ge).

A combined thickness of the SiGe gradient layer 51 and the constant Ge layer 52 can be about 2-3 microns or more. In accordance with one or more embodiments, the combined thickness of the SiGe gradient layer 51 and the constant Ge layer 52 can exceed a critical thickness whereby SiGe relaxation will occur and thus lead to an increase in a lattice parameter thereof, which will, in turn, lead to an application of tension in silicon disposed thereon.

With reference to FIGS. 4A-4D, the hard mask 12 is stripped from the logic nFET section 31 and the logic pFET section 32. Subsequently epitaxial growth of silicon is conducted in the SRAM nFET section 21, the SRAM pFET section 22, the logic nFET section 31 and the logic pFET section 32. This epitaxial growth of Si leads to the formation of an additional Si layer in the logic nFET section 31 and the logic pFET section 32 over the semiconductor substrate 11 that is exposed by the stripping of the hard mask 12. Within the SRAM nFET section 21 and the SRAM pFET section 22, however, the epitaxial growth of Si leads to the formation of a tensile Si layer 60 over the uppermost surface 520 of the relaxed SiGe layer 52.

With reference to FIGS. 5A-5D, once the tensile Si layer 60 is epitaxially grown, a new hard mask 70 is deposited in the SRAM nFET section 21, the SRAM pFET section 22, the logic nFET section 31 and the logic pFET section 32. The new hard mask 70 can be formed of any dielectric material such as, but not limited to, $SiO_2$ or SiN.

With reference to FIGS. 6A-6B, a photoresist block 80 is deposited over the new hard mask 70 in the SRAM nFET section 21 to thereby leave open or exposed the new hard mask 70 in the SRAM pFET section 22, the logic nFET section 31 and the logic pFET section 32.

With reference to FIGS. 7A-7D, the new hard mask 70 in the SRAM nFET section 22, the logic nFET section 31 and the logic pFET section 32 is stripped. At this point, the resulting and now exposed uppermost Si layers in the semiconductor substrate 11 in the logic nFET section 31 and the logic pFET section 32 are recessed by RIE processing. Meanwhile, this RIE processing removes the tensile Si layer 60 in the SRAM pFET section 22 to thereby expose the uppermost surface 520 of the constant Ge layer 52 in the SRAM pFET section 22.

With reference to FIGS. 8A-8D, the photoresist block 80 is stripped in the SRAM nFET section 21 to expose the new hard mask 70 therein. Prior to, at that time or subsequently, a selective SiGe 90 layer is selectively grown in the SRAM nFET section 22, the logic nFET section 31 and the logic pFET section 32. The selective SiGe layer 90 is provided for use in the eventual formation of pFET channels in the SRAM pFET section 22 and the logic pFET section 32 and includes a Ge concentration of between about 20% to about 50%. The selective SiGe layer 90 can be, but is not required to be, substantially similar in thickness as the tensile Si layer 60 in the SRAM nFET section 21.

With reference to FIGS. 9A-9D, the new hard mask 70 is stripped in the SRAM nFET section 21. Subsequently, a second new hard mask 100 is deposited in the SRAM nFET section 21, the SRAM nFET section 22, the logic nFET section 31 and the logic pFET section 32. The second new hard mask 100 can be formed of any dielectric such as, but not limited to, $SiO_2$ and SiN.

With reference to FIGS. 10A-10D, a photoresist block 110 is deposited in the SRAM nFET section 21, the SRAM pFET section 22 and the logic pFET section 32. The logic nFET section 31 is left open and exposed.

With reference to FIGS. 11A-11D, once the photoresist block 110 is deposited in the SRAM nFET section 21, the SRAM pFET section 22 and the logic pFET section 32, the second new hard mask 100, the selective SiGe layer 90 and upper portions of the semiconductor substrate 11 are stripped, removed and recessed, respectively, in the logic nFET section 31.

At this point, with reference to FIGS. 12A-12D, the photoresist block 110 is stripped from the SRAM nFET section 21, the SRAM pFET section 22 and the logic pFET section 32 to re-expose the second new hard mask 100 therein. Layers of SiGe and Si are then re-grown in the logic nFET section 31. The layers of SiGe that are re-grown include a first SiGe layer 120 that is grown atop the semiconductor substrate 11 and a second Si layer 130 that is grown atop the first SiGe layer 120.

With reference to FIGS. 13A-13D, fin formations 140 are formed in the SRAM nFET section 21, the SRAM nFET section 22, the logic nFET section 31 and the logic pFET section 32.

Figure 13B:
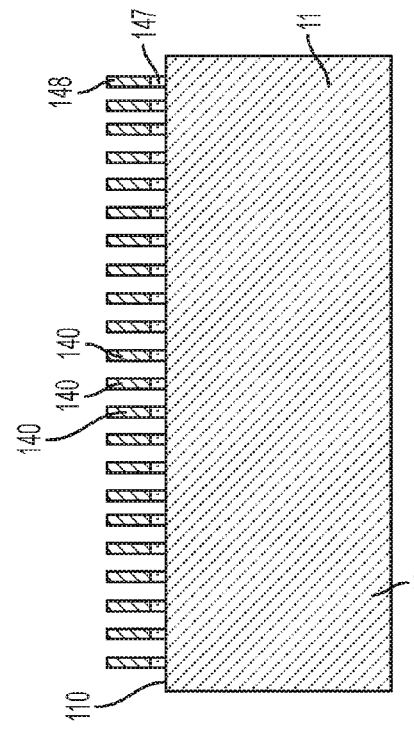
FIG. 13B is a side view of fin formations formed in the nFET section of the logic region in accordance with one or more embodiments.
Figure 13A:
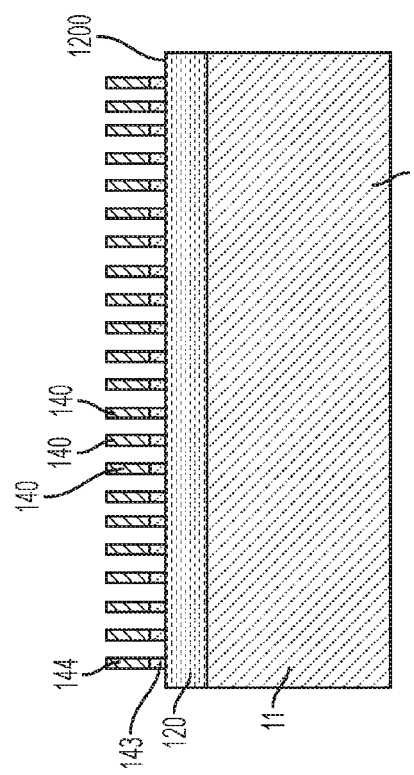
FIG. 13A is a side view of fin formations formed in the nFET section of the SRAM region in accordance with one or more embodiments.

Within the SRAM nFET section 21, as shown in FIG. 13A, each of the fin formations 140 includes an Si fin portion 141 that extends upwardly from the uppermost surface 520 of the relaxed SiGe layer 52 and a hard mask fin portion 142 that extends upwardly from an uppermost end of the Si fin portion 141. The Si fin portions 141 represent remainders of the tensile Si layer 60 and the hard mask fin portions 142 represent remainders of the new hard mask 100 following an execution of lithography or other similar processes.

Within the logic nFET section 31, as shown in FIG. 13B, each of the fin formations 140 includes an Si fin portion 143 that extends upwardly from an uppermost surface 1200 of the first SiGe layer 120 and a hard mask fin portion 144 that extends upwardly from an uppermost end of the Si fin portion 143. The Si fin portions 143 represent remainders of the second Si layer 130 following an execution of lithography or other similar processes and the hard mask fin portions 144 represent remainders of a hard mask layer that would have been deposited over the second Si layer 130 prior to the lithography.

Figure 13D:
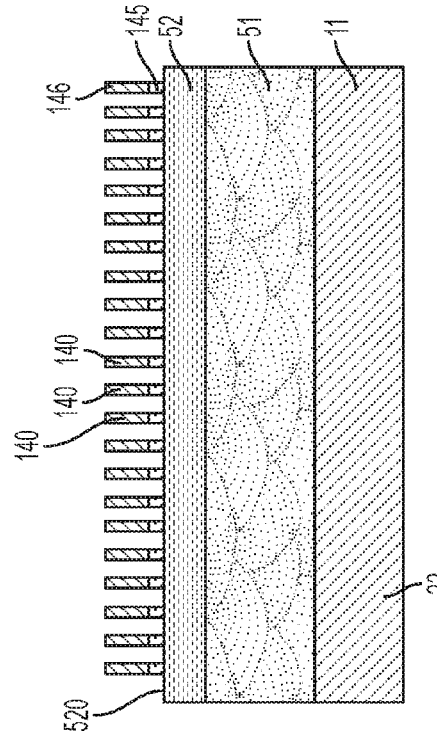
FIG. 13D is a side view of fin formations formed in the pFET section of the logic region in accordance with one or more embodiments.
Figure 13C:
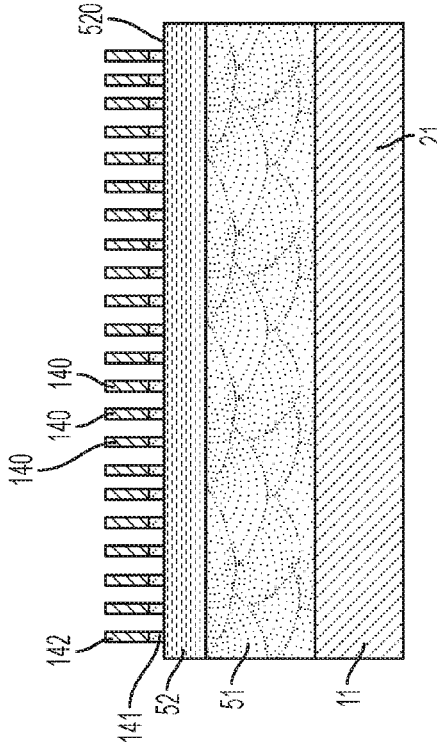
FIG. 13C is a side view of fin formations formed in the pFET section of the SRAM region in accordance with one or more embodiments.
Figure 15B:
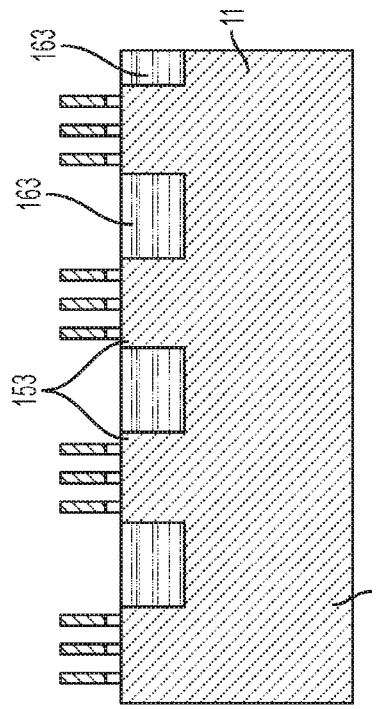
Figure 15D:
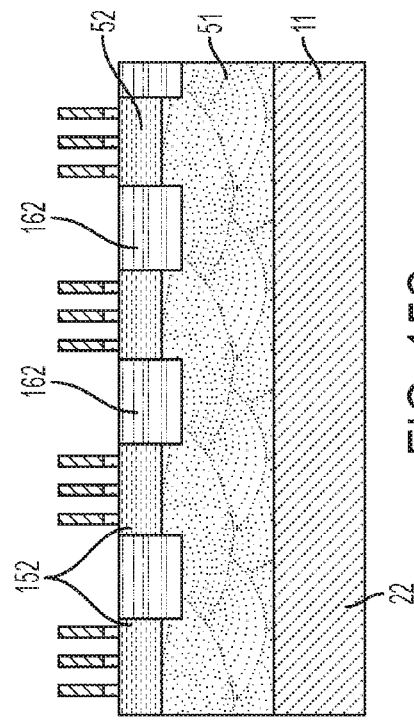
Figure 15A:
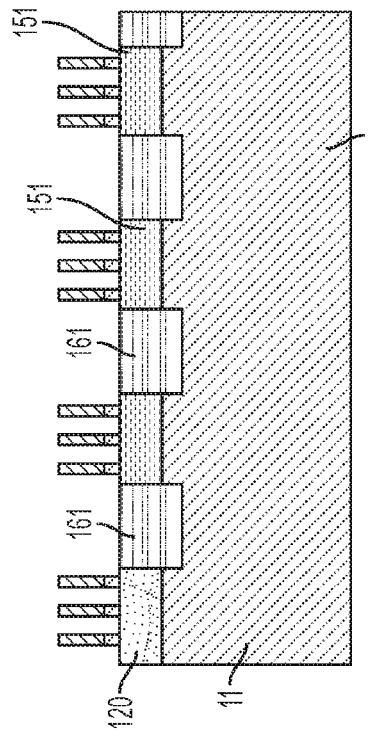
Figure 15C:
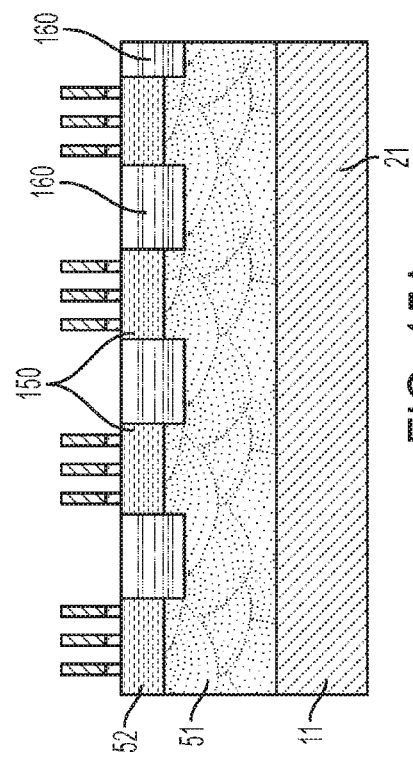

Within the SRAM pFET section 22, as shown in FIG. 13C, each of the fin formations 140 includes an SiGe fin portion 145 that extends upwardly from the uppermost surface 520 of the relaxed SiGe layer 52 and a hard mask fin portion 146 that extends upwardly from an uppermost end of the SiGe fin portion 145. The SiGe fin portions 145 represent remainders of the selective SiGe layer 90 and the hard mask fin portions 146 represent remainders of the new hard mask 100 following an execution of lithography or other similar processes.

Within the logic pFET section 32, as shown in FIG. 13D, each of the fin formations 140 includes a SiGe fin portion 147 that extends upwardly from the uppermost surface 110 of the semiconductor substrate 11 and a hard mask fin portion 148 that extends upwardly from an uppermost end of the SiGe fin portion 147. The SiGe fin portions 147 represent remainders of the selective SiGe layer 90 and the hard mask fin portions 148 represent remainders of the new hard mask 100 following an execution of lithography or other similar processes.

With reference to FIGS. 14A-14D, once the fin formations 140 are formed, isolation and shallow trench isolation (STI) RIE processing is conducted.

Within the SRAM nFET section 21, as shown in FIG. 14A, the isolation and STI RIE processing results in corresponding parts of the relaxed SiGe layer 52 and the upper portions of the SiGe gradient layer 51 as well as local fin formations 140 being removed. The remaining parts of the relaxed SiGe layer 52 and the upper portions of the SiGe gradient layer 51, which are not subject to the isolation and STI RIE processing, cooperatively form SRAM nFET section pillars 150. The remaining fin formations 140 extend upwardly from the SRAM nFET section pillars 150. The opposite sides of the SRAM nFET section pillars 150 are free surfaces 1500 that run in parallel with sides of the fin formations 140 and are perpendicular with respect to ends of the fin formations 140. Creating free surfaces 1500 at the proximity of the fins does not impact significantly the amount of tensile stress in the Silicon channel as the substrate with constant Ge 52 is already relaxed plastically.

Within the logic nFET section 31, as shown in FIG. 14B, the isolation and STI RIE processing results in corresponding parts of the first SiGe layer 120 and upper portions of the semiconductor substrate 11 as well as local fin formations 140 being removed. The remaining parts of the first SiGe layer 120 and the upper portions of the semiconductor substrate 11, which are not subject to the isolation and STI RIE processing, cooperatively form logic nFET section pillars 151. The remaining fin formations 140 extend upwardly from the logic nFET section pillars 151. The opposite sides of the logic nFET section pillars 151 are free surfaces 1510 that run in parallel with sides of the fin formations 140 and are perpendicular with respect to ends of the fin formations 140. The free surfaces 1510 permit elastic relaxation of the first SiGe layer 120 such that a corresponding tension is applied to the silicon in the remaining fin formations 140 within the logic nFET section 31. This method tends to mitigate the generation of defects in the remaining fin formations 140.

Thus, as shown in FIG. 14B, the logic nFET section 31 is provided for an integrated device 1400 and includes the semiconductor substrate 11, remaining portions of the first SiGe layer 120 disposed on the semiconductor substrate 11 and fin formations 140. The fin formations 140 are formed on the first SiGe layer 120 and each one of the fin formations 140 includes a Si fin portion 143 and a hard mask fin portion 144. The first SiGe layer 120 is etched such that the remaining portions of the first SiGe layer 120 includes the free surfaces 1510 that facilitate the elastic relaxation of the SiGe in the remaining portions of the first SiGe layer 120 as well as the corresponding application of tension in the Si of the Si fin portions 143 of each of the remaining fin formations 140.

Within the SRAM pFET section 22, as shown in FIG. 14C, the isolation and STI RIE processing results in corresponding parts of the relaxed SiGe layer 52 and upper portions of the SiGe gradient layer 51 as well as local fin formations 140 being removed. The remaining parts of the relaxed SiGe layer 52 and the upper portions of the SiGe gradient layer 51, which are not subject to the isolation and STI RIE processing, cooperatively form SRAM pFET section pillars 152. The remaining fin formations 140 extend upwardly from the SRAM pFET section pillars 152. The opposite sides of the SRAM pFET section pillars 152 are free surfaces 1520 that run in parallel with sides of the fin formations 140 and are perpendicular with respect to ends of the fin formations 140. Creating free surfaces 1520 at the proximity of the fins does not impact significantly the amount of compressive stress in the remaining SiGe fin portions 145 as the substrate with constant Ge 52 is already relaxed plastically.

Within the logic pFET section 32, as shown in FIG. 14D, the isolation and STI RIE processing results in corresponding parts of the upper portions of the semiconductor substrate 11 as well as local fin formations 140 being removed. The remaining parts of the upper portions of the semiconductor substrate 11, which are not subject to the isolation and STI RIE processing, cooperatively form logic pFET section pillars 153. The remaining fin formations 140 extend upwardly from the logic pFET section pillars 153. The opposite sides of the logic pFET section pillars 153 are free surfaces 1530 that run in parallel with sides of the fin formations 140 and are perpendicular with respect to ends of the fin formations 140. Creating free surfaces 1530 at the proximity of the fins does not impact the compressive amount of stress in the remaining SiGe fin portions 147 as the substrate is relaxed silicon.

Thus, as shown in FIGS. 14A-14D, the integrated device 1400 is provided and includes the SRAM region 20 and the logic region 30. The SRAM region 20 includes the SRAM nFET section 21 and the SRAM pFET section 22 and the logic region 30 includes the logic nFET section 31 and the logic pFET section 32. Within the SRAM nFET section 21, fin formations 140 with tensile Si are formed on plastically relaxed SiGe of the SRB layer 50. Within the logic nFET section, fin formations 140 with tensile Si are formed on a selective SiGe layer 90 with elastically relaxed SiGe. With the SRAM pFET section 22, fin formations 140 with relaxed or compressive SiGe are formed on the SRB layer 50 with plastically relaxed SiGe. Within the logic pFET section, fin formations 140 with relaxed or compressive SiGe are formed on a semiconductor substrate 11 with relaxed Si.

With reference to FIGS. 15A-15D, dielectric material is deposited between the SRAM nFET section pillars 150 in the SRAM nFET section 21 to form STI elements 160, dielectric material is deposited between the logic nFET section pillars 151 in the logic nFET section 31 to form STI elements 161, dielectric material is deposited between the SRAM nFET section pillars 152 in the SRAM pFET section 22 to form STI elements 162 and dielectric material is deposited between the logic pFET section pillars 153 in the logic pFET section 32 to form STI elements 163.

Descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. An n-doped field effect transistor (nFET) section of an integrated device logic region, the nFET section comprising:
    a semiconductor substrate;
    a layer at least partially formed of silicon germanium (SiGe) disposed on the semiconductor substrate; and
    fin formations formed on the layer, each fin formation comprising a first fin portion at least partially formed of silicon (Si) and a second fin portion at least partially formed of hard mask material,
    the layer being etched to include free surfaces that facilitate elastic relaxation of SiGe therein and a corresponding application of tension in Si of the first fin portion of each of the fin formations.

2. The nFET section according to claim 1, wherein the layer is etched parallel to sides of the fin formations and perpendicular to ends of the fin formations.

3. The nFET section according to claim 1, wherein the layer and an upper layer of the semiconductor substrate are etched.

4. The nFET section according to claim 1, wherein the free surfaces cooperatively form pillars on which the fin formations are formed.

5. The nFET section according to claim 4, further comprising shallow trench isolation (STI) elements between adjacent pillars.

6. An integrated device comprising:
    a static random access memory (SRAM) region comprising an n-doped field effect transistor (nFET) section in which tensile silicon (Si) fins are formed on a plastically relaxed silicon germanium (SiGe) substrate; and
    a logic region comprising an nFET section in which tensile silicon fins are formed on an elastically relaxed SiGe substrate.

7. The integrated device according to claim 6, wherein:
    the SRAM region further comprises a p-doped field effect transistor (pFET) section in which relaxed or compressive SiGe fins are formed on a plastically relaxed SiGe substrate, and
    the logic region further comprises a p-doped field effect transistor (pFET) section in which compressive SiGe fins are formed on a relaxed Si substrate.

8. The integrated device according to claim 7, wherein the plastically relaxed SiGe substrates of the nFET and pFET sections of the SRAM region are between 2-3 microns thick.

9. The integrated device according to claim 7, wherein the plastically relaxed SiGe substrates of the nFET and pFET sections of the SRAM region comprise SiGe relaxed buffer layers with an SiGe gradient layer and a constant germanium (Ge) layer.

10. The integrated device according to claim 9, wherein the SiGe gradient layer portions have 5-20% Ge.

11. The integrated device according to claim 7, wherein:
    the nFET section of the SRAM region comprises shallow trench isolation (STI) elements between adjacent SiGe pillars,
    the nFET section of the logic region comprises shallow trench isolation (STI) elements between adjacent SiGe pillars,
    the pFET section of the SRAM region comprises shallow trench isolation (STI) elements between adjacent SiGe pillars, and
    the pFET section of the logic region comprises shallow trench isolation (STI) elements between adjacent Si pillars.

12. A method of processing a wafer comprising first and second sections of memory and logic regions, the method comprising:
    forming fins on a relaxed buffer layer in the first section of the memory region;
    forming fins on a substrate layer in the first section of the logic region;
    etching the relaxed buffer layer to encourage plastic relaxation of the relaxed buffer layer and a corresponding application of tension to the fins in the first section of the memory region; and
    etching the substrate layer to encourage elastic relaxation of the substrate layer and a corresponding application of tension to the fins in the first section of the logic region.

13. The method according to claim 12, wherein:
    the first sections of the memory and logic regions comprise n-doped field effect transistors (nFETs), and
    the second sections of the memory and logic regions comprise p-doped field effect transistors (pFETs).

14. The method according to claim 12, wherein the memory region comprises a static random access memory (SRAM) region.

15. The method according to claim 12 further comprising:
    recessing the memory region while blocking the logic region;
    growing a silicon germanium (SiGe) relaxed buffer (SRB) layer in the memory region and subsequently growing a tensile silicon (Si) layer in the memory and logic regions;
    replacing the tensile Si layer with an SiGe layer in the first section of the logic region and in the second sections of the memory and logic regions; and
    replacing the SiGe layer with an SiGe/Si layer in the first section of the logic region.

16. The method according to claim 15, wherein the recessing comprises recessing the memory region by at least 2 microns.

17. The method according to claim 15, wherein the growing of the SRB comprises:
    growing an SiGe gradient layer; and
    growing a constant germanium (Ge) layer.

18. The method according to claim 17, wherein the SiGe gradient layer comprises 5-20% Ge.

19. The method according to claim 12, wherein the etching comprises etching in parallel with sides of the fins and etching perpendicularly with respect to ends of the fins.

20. The method according to claim 12, further comprising depositing shallow trench isolation (STI) elements between etched pillars in the memory and logic regions.

\* \* \* \* \*